United States Patent [19]
Yang

[11] Patent Number: 5,927,589
[45] Date of Patent: Jul. 27, 1999

[54] METHOD AND FIXTURE FOR USE IN BONDING A CHIP TO A SUBSTRATE

[75] Inventor: Renyi Yang, Allentown, Pa.

[73] Assignee: Lucent Technologies Inc., Murray Hill, N.J.

[21] Appl. No.: 08/978,019

[22] Filed: Nov. 25, 1997

[51] Int. Cl.[6] .......................... B23K 37/00; B23K 37/04; B25B 11/00; B25B 27/14
[52] U.S. Cl. .......................... 228/44.7; 228/49.5; 269/21; 29/281.1
[58] Field of Search .................... 228/44.7, 49.5, 228/180.22, 212; 269/21, 293, 900; 29/239, 281.1; 100/101, 219

[56] References Cited

U.S. PATENT DOCUMENTS

| | | | |
|---|---|---|---|
| 3,851,758 | 12/1974 | Makhijani et al. | 206/328 |
| 4,607,779 | 8/1986 | Burns | 228/106 |
| 4,664,309 | 5/1987 | Allen et al. | 228/180.2 |
| 4,893,403 | 1/1990 | Heflinger et al. | 29/840 |
| 4,907,959 | 3/1990 | Hauch | 425/406 |
| 5,302,801 | 4/1994 | Kanda et al. | 219/121.63 |
| 5,417,408 | 5/1995 | Ueda | 269/21 |
| 5,641,112 | 6/1997 | Moradi et al. | 228/49.5 |

*Primary Examiner*—Patrick Ryan
*Assistant Examiner*—Kiley Stoner

[57] ABSTRACT

A fixture for use in the bonding of a plurality of chips each to a respective one of a plurality of substrates includes a lower vacuum chuck and a frame member supported on the chuck for reciprocatory motion toward and away from the chuck surface. The chuck surface is arranged to hold substrates with predeposited solder in pockets at predetermined locations thereon. The frame member has openings aligned with those pockets and weights which extend through the openings. After substrates are placed on the chuck surface, the substrates are heated so that the predeposited solder reaches eutectic status, and then chips are placed on the substrates. The frame member is then mounted on the chuck and gradually lowered until the weights press against respective chips, thereby holding the chips in position on the substrates. The entire assembly is then transported to a solder reflow bonding station.

5 Claims, 2 Drawing Sheets

5,927,589

METHOD AND FIXTURE FOR USE IN BONDING A CHIP TO A SUBSTRATE

BACKGROUND OF THE INVENTION

This invention relates to the bonding of a chip to a substrate and, more particularly, to a method and fixture for use in such a bonding process to provide increased throughput.

At the present time, semiconductor laser chips are mounted to a silicon optical bench (or substrate) one at a time. In present practice, the substrates are predeposited with solder and a pick and place machine uses a vacuum collect to pick up a single substrate from a substrate cassette and place it on a lower vacuum chuck. The chip is then picked up by the upper vacuum chuck and held on top of the substrate. Heat is then applied to the substrate and chip through the chucks to melt the solder and bond the chip to the substrate. A number of problems are associated with this present practice.

The present practice is time consuming. Wafer level assembly or multiple substrate assembly is impossible because the substrate will not withstand multiple solder reflows, which deteriorate the solder composition. In addition, the time necessary for the bonding, which includes tacking and heating/cooling, is twice as long as for just tacking.

The present practice also results in poor solder joint quality. Thus, since the solder is reflowed in an open environment, even with a gas purge oxidation is still unavoidable. Further, the final composition of solder joints vary on a single substrate with multiple joints because of the nature of the sequential bonding. Also, the process has to be changed from time to time when a different substrate with different joints is used.

It would therefore be desirable to be able to perform wafer-level assembly or multiple substrate assembly, without the disadvantages described above.

SUMMARY OF THE INVENTION

The foregoing and additional objects are attained in accordance with the principles of this invention by providing a lower vacuum chuck having at least one pocket on an upper surface of the chuck and at least one guide member extending upwardly from the surface. One or more solder predeposited substrates are placed in respective ones of the pockets on the chuck surface. The chuck is heated so that the solder on the substrates reaches its eutectic temperature to make the solder tacky. Chips are then placed on respective substrates with sufficient pressure so that each chip adheres to its substrate due to the tackiness of the solder. A frame member adapted for mounting on the at least one guide member is provided. The frame member is capable of reciprocating movement toward and away from the chuck surface and has a plurality of openings each in registration with a respective one of the pockets. A plurality of weight press members is provided, each weight press member extending through a respective frame member opening. Each weight press member has a downwardly directed upper shoulder adapted for resting on the frame member when the weight press member extends through an opening so that the weight press member is supportable by the frame member. The frame member with the plurality of supported weight press members is mounted on the at least one guide member and then gradually lowered toward the chuck surface until each weight press member engages a respective one of the chips and the shoulders of the weight press members are no longer supported by the frame member. The entire assembly of the chuck, the frame member and the weight press members, along with the plurality of substrates and chips, is then transported to a solder reflow bonding station, with the chips and the substrates being maintained relatively positioned each to the other by the weight press members during the reflow solder bonding process.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
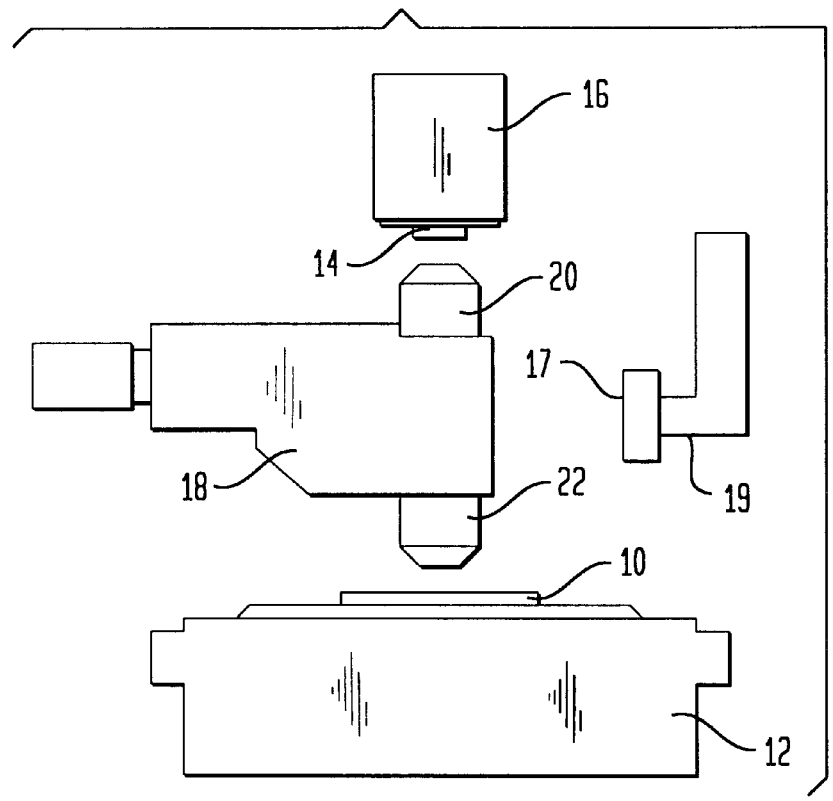
FIG. 1 is a schematic representation of a prior art pick and place bonding machine.

It is intended that the present invention be utilized with commercially available equipment. Illustratively, placement of a chip on a substrate is effected by using a Karl Suss FC-150 pick and place bonder and final bonding of the chips to the substrates is effected using a FABCO VIZO-TEMP sealed gas chamber strip heater. FIG. 1 illustrates the major components of a prior art pick and place apparatus, such as the Karl Suss FC-150. Thus, a lower vacuum chuck 10 is supported by a base 12 and an upper vacuum chuck 14 is mounted to a movable arm 16. In operation, a vacuum collet 17 secured to a movable arm 19 is initially positioned over a supply of substrates (not shown but typically in the form of a cassette) and is lowered to a level where the vacuum collect 17 picks up a substrate. The vacuum collet 17 is then positioned over the lower vacuum chuck 10 and the substrate is transferred from the vacuum collet 17 to the lower vacuum chuck 10. The upper vacuum chuck 14 is then positioned over a supply of chips by the movable arm 16 and lowered so that a chip is picked up by the upper vacuum chuck 14. The movable arm 16 is then positioned over the base 12 and an optics assembly 18, typically including a split view microscope with two objectives 20, 22, is used to insure that the chip held by the upper vacuum chuck 14 is in vertical registration with the substrate held by the lower vacuum chuck 10. The optics assembly 18 is then moved away and the movable arm 16 is moved downwardly to place the chip on the substrate. In the Karl Suss FC-150 apparatus, heat can be applied to the lower vacuum chuck 10 to cause the predeposited solder on the substrate to flow in order to bond the chip to the substrate.

Figure 2:
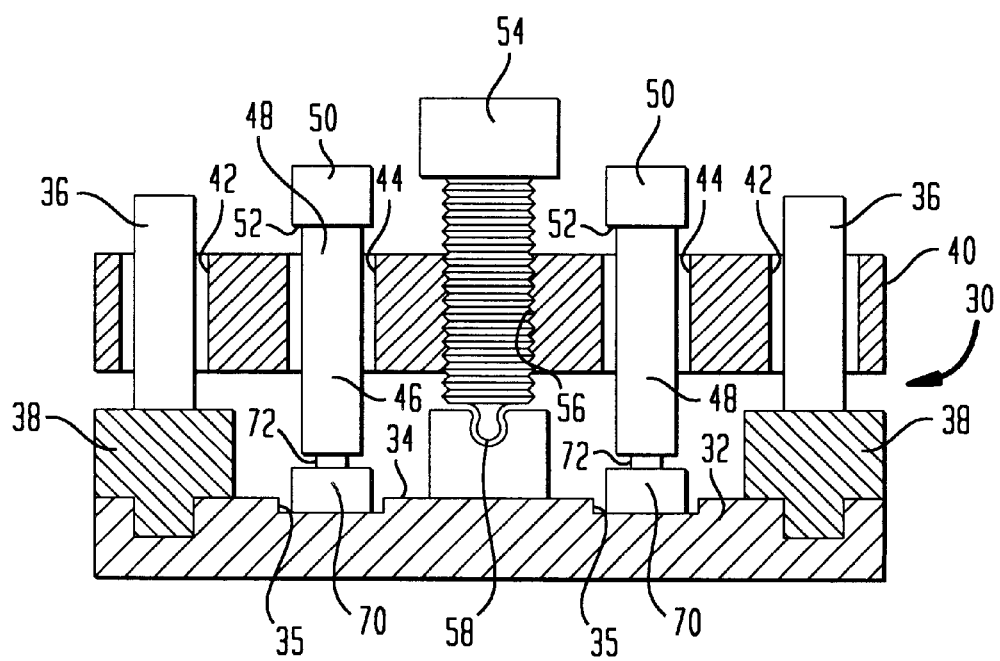
FIG. 2 is a schematic side view, partially sectioned, of an illustrative fixture according to the present invention for practicing the present invention.

FIG. 2 schematically shows an illustrative fixture, designated generally by the reference numeral 30, for practicing the present invention. The fixture 30 includes a lower vacuum chuck 32 adapted to take the place of the lower vacuum chuck 10 on the base 12 (FIG. 1). The chuck 32 includes an upper surface 34 in which are formed a number of pockets 35 at predetermined locations. Although the pockets 35 are shown as recesses, or depressions, in the surface 34, the pockets 35 may be formed in other ways, such as by raised ribs surrounding an area on the surface 34. In any event, the purpose of the pockets 35 is to limit horizontal movement of a chip placed on the surface 34, and it is intended that this invention not be limited to the specific recessed pockets which are illustrated. Guide rails 36 are mounted to the chuck 32 by means of support bases 38 and extend upwardly from the surface 34. The fixture 30 also includes a frame member 40 which has openings 42 for enabling the frame member 40 to be mounted on the guide rails 36 and be capable of reciprocating movement toward and away from the surface 34.

As will be described, substrates will be held in pockets 35 at predetermined locations on the chuck surface 34. The frame member 40 is therefore formed with openings 44 which are each in registration with a respective one of the pockets 35 when the frame member 40 is mounted on the guide rails 36. Associated with each of the openings 44 is a weight press member 46. Each weight press member 46 includes an elongated portion 48 topped by a head 50. The head 50 has a downwardly directed shoulder 52 which extends beyond the periphery of the opening 44 so that the weight press member 46 is supportable by the frame member 40. The elongated portion 48 of the weight press member 46 and the opening 44 are configured and sized so that the weight press member 46 is movable relative to the frame member 40 toward and away from the surface 34 and the tolerance between the weight press member 46 and the opening 44 is such that the maximum tilting angle of the weight press member 46 is within the tolerance of the chip tilting against the reference surface of the substrate. Preferably, both the frame member 40 and the weight press member 46 are formed from low thermal expansion material. Also, the weight of each weight press member 46 should be greater than the lifting force caused by liquidized solder surface tension.

The fixture 30 is further provided with a height adjustment mechanism which cooperates with the frame member 40 and the chuck 32 for controlling the distance between the frame member 40 and the surface 34 when the frame member 40 is mounted on the guide rails 36. Illustratively, this height adjustment mechanism includes an externally threaded adjusting screw 54 engaged in an internally threaded opening 56 of the frame member 40. The adjusting screw 54 and the chuck 32 have cooperating structure which allows rotational movement of the screw 54 but prevents linear movement of the screw 54 relative to the chuck 32. Illustratively, this cooperating structure may be a snap-in ball and socket arrangement 58.

Figure 3:
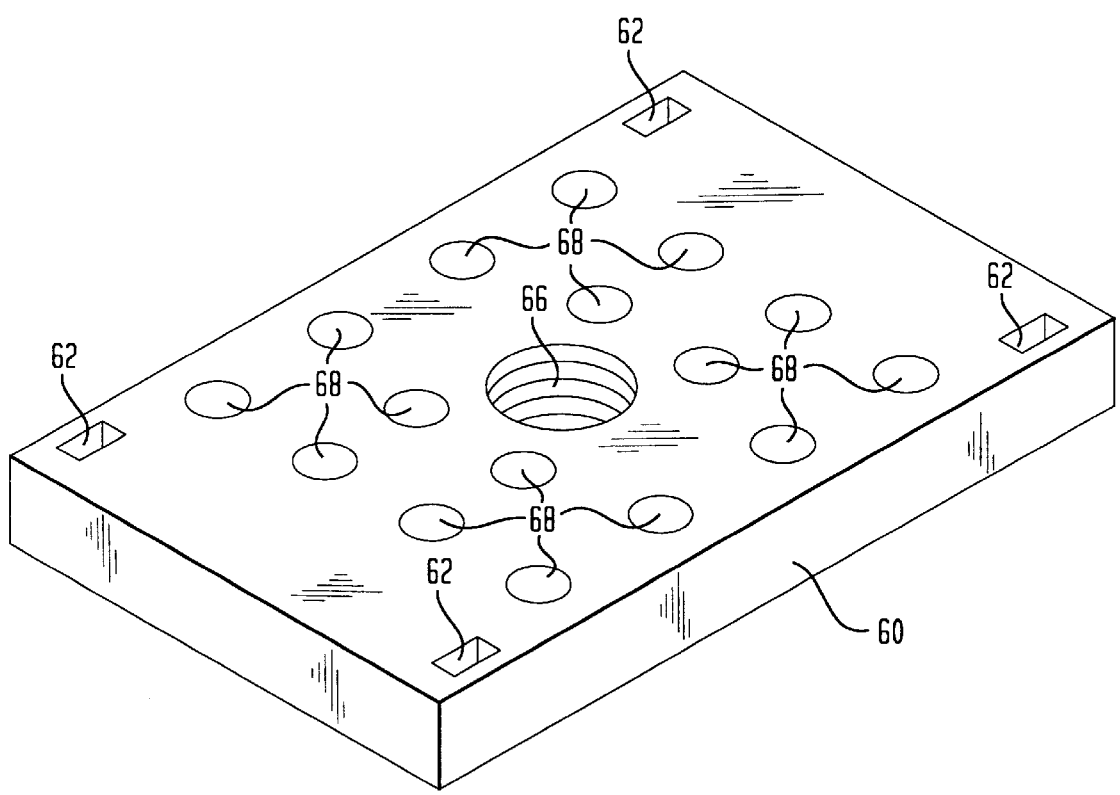
FIG. 3 is a schematic perspective view of a frame member according to the present invention.

FIG. 3 is a perspective view of an illustrative frame member 60 for use with a larger number of chips and substrates than is shown in FIG. 2. Thus, the frame member 60 is illustratively rectangular and has openings 62 in its corners for cooperating with guide rails on the chuck. A central threaded opening 66 cooperates with the adjusting screw and a plurality of openings 68 are aligned with substrate holding pockets on the chuck surface and are each associated with a respective weight press member.

In use, the chuck 32 is installed on the base 12 of the Karl Suss FC-150 pick and place bonder. A plurality of substrates 70 are then taken from a supply and placed in the pockets 35 at predetermined locations on the surface 34 of the chuck 32. Heat is then applied to the chuck 32 so that the solder, which was predeposited on the substrates 70, reaches eutectic status so that it becomes tacky. A plurality of chips 72 are then placed one-by-one each on a respective one of the substrates 70 with sufficient pressure so that they adhere to the tacky solder. The frame member 40, with the weight press members 46 supported thereby, is then mounted on the guide rails 36. Prior to this mounting, the adjusting screw 54 is turned substantially fully clockwise so that when the ball and socket engage, the frame member 40 is sufficiently away from the surface 34 that the lower ends of the weight press members 46 are out of contact with the respective chips 72. The adjusting screw 54 is then turned counterclockwise to gradually lower the frame member 40 toward the surface 34 until the weight press members 46 engage respective ones of the chips 72 and the shoulders 52 of the weight press members 46 are no longer supported by the frame member 40. With the fixture 30 in this condition, the chips 72 and the substrate 70 are maintained relatively positioned each to the other by the weight press members 46. The entire assembly including the chuck 32, the frame member 40, and the weight press members 46, as well as the substrates 70 and chips 72 are then transported to a solder reflow bonding station, illustratively a FABCO heater. In the FABCO heater, heat is applied to the assembly and the solder on the substrates 70 is caused to reflow to bond the chips 72 to the substrates 70. After the heater has cooled down, the assembly is removed and the adjusting screw 54 turned clockwise to lift the frame member 40 and the weight press members 46 away from the surface 34, and out of contact with the chips 72. The adjusting screw 54 is then unsnapped from the chuck 32 and the frame member 40 is removed from the guide rails 36, thereby exposing the substrates 70 with the chips 72 bonded thereto. The substrates and bonded chips are then removed from the processing. The fixture 30 may then be reused.

Although the above discussion has assumed that discrete substrates are being processed, it is contemplated that an entire wafer having a plurality of substrates may be disposed on the chuck 32. In this case, modifications would have to be made so that the chuck 32 could accommodate the wafer.

Accordingly, there has been disclosed an improved method and fixture for use in the bonding of chips to substrates. While an exemplary embodiment of the present invention has been disclosed herein, it is understood that various modifications and adaptations to the disclosed embodiment will be apparent to those of ordinary skill in the art and it is intended that this invention be limited only by the scope of the appended claims.

What is claimed is:

1. A fixture for use in the bonding of a chip to a substrate, comprising:

a lower vacuum chuck formed with a pocket at a predetermined location on an upper surface for holding said substrate on said surface;

at least one guide member mounted to said chuck and extending upwardly from said surface;

a frame member mountable on said at least one guide member and adapted to cooperate with said at least one guide member so as to be capable of reciprocating movement toward and away from said surface, said frame member having an opening in registration with said pocket when said frame member is mounted on said at least one guide member;

a weight press member extending through said opening and movable relative to said frame member toward and away from said surface when said frame member is mounted on said at least one guide member, said weight press member having a first end between said surface and said frame member and a second end on the opposite side of said frame member from said surface, said second end having a portion extending beyond the periphery of said opening so that said weight press member is supportable by said frame member; and a height adjustment mechanism cooperating with said frame member and said chuck and manipulatable to control the distance between said frame member and said surface when said frame member is mounted on said at least one guide member;

whereby a substrate is placed in said pocket on said surface, a chip is placed on said substrate, said frame member is mounted on said at least one guide member, and said height adjustment mechanism is manipulated to gradually lower said frame member sufficiently that said weight press member is lowered into pressing engagement with said chip to maintain said chip in position on said substrate during subsequent transportation of said fixture to a solder reflow bonding station.

2. The fixture according to claim 1 wherein said chuck upper surface has a plurality of pockets each at a respective one of a plurality of predetermined locations and each for holding a respective one of a plurality of substrates, said frame member has a plurality of openings each in registration with a respective one of said plurality of pockets, and there are a plurality of weight press members each associated with a respective one of said plurality of openings.

3. The fixture according to claim 1 wherein said frame member includes an internally threaded opening and said height adjustment mechanism includes an externally threaded member engaging said internally threaded opening.

4. The fixture according to claim 3 wherein said externally threaded member and said chuck have cooperating structure to allow rotational movement of said threaded member and to prevent linear movement of said threaded member relative to said chuck.

5. The fixture according to claim 1 wherein said substrate is predeposited with solder prior to placement thereon of said chip, and said weight press member is formed of low thermal expansion material and has a weight greater than the lifting force caused by liquidized solder surface tension.

* * * * *